United States Patent [19]

Chauvin et al.

[11] Patent Number: 4,611,182

[45] Date of Patent: Sep. 9, 1986

[54] METHOD AND DEVICE FOR CONTROLLING THE HEATING OF A THERMOSTATICALLY CONTROLLED ENCLOSURE FOR AN OSCILLATOR

[75] Inventors: Jacques Chauvin, Sartrouville; Patrice Canzian, Argenteuil, both of France

[73] Assignee: Compagnie d'Electronique et de Piezo-Electricite C.E.P.E., Argenteuil, France

[21] Appl. No.: 661,049

[22] Filed: Oct. 15, 1984

[30] Foreign Application Priority Data

Oct. 18, 1983 [FR] France .................. 83 16549

[51] Int. Cl.⁴ .............................................. H03L 1/04
[52] U.S. Cl. .................................. 331/69; 219/210; 310/343; 331/176
[58] Field of Search ............... 331/69, 70, 66, 158, 331/176; 219/210, 209, 501; 310/315, 343

[56] References Cited

U.S. PATENT DOCUMENTS 4,216,371  8/1980  Marotel .................. 219/210 X

FOREIGN PATENT DOCUMENTS 0004233  9/1979  European Pat. Off. .

Primary Examiner—Siegfried H. Grimm
Attorney, Agent, or Firm—Oblon, Fisher, Spivak, McClelland & Maier

[57] ABSTRACT

A method and a device for regulating the heating of a thermostatically controlled enclosure of a quartz oscillator. During a first stage, the thermostatically controlled enclosure is exposed to an external temperature close to the maximum operating temperature and the frequency of the oscillator is measured. During a second stage, the thermostatically controlled enclosure is exposed to an external temperature close to the minimum temperature of the range and the difference between the frequency of the oscillator and the frequency previously measured is cancelled out by modifying the distribution of the powers dissipated by the heating elements of the thermostatically controlled enclosure. The heating of the enclosure is performed by a chain of voltage stabilizer semiconductor circuits connected in series, each of the circuits being traversed by a regulated heating current. The regulating of the heating action is performed by modifying the stabilized voltages of the circuits.

15 Claims, 9 Drawing Figures

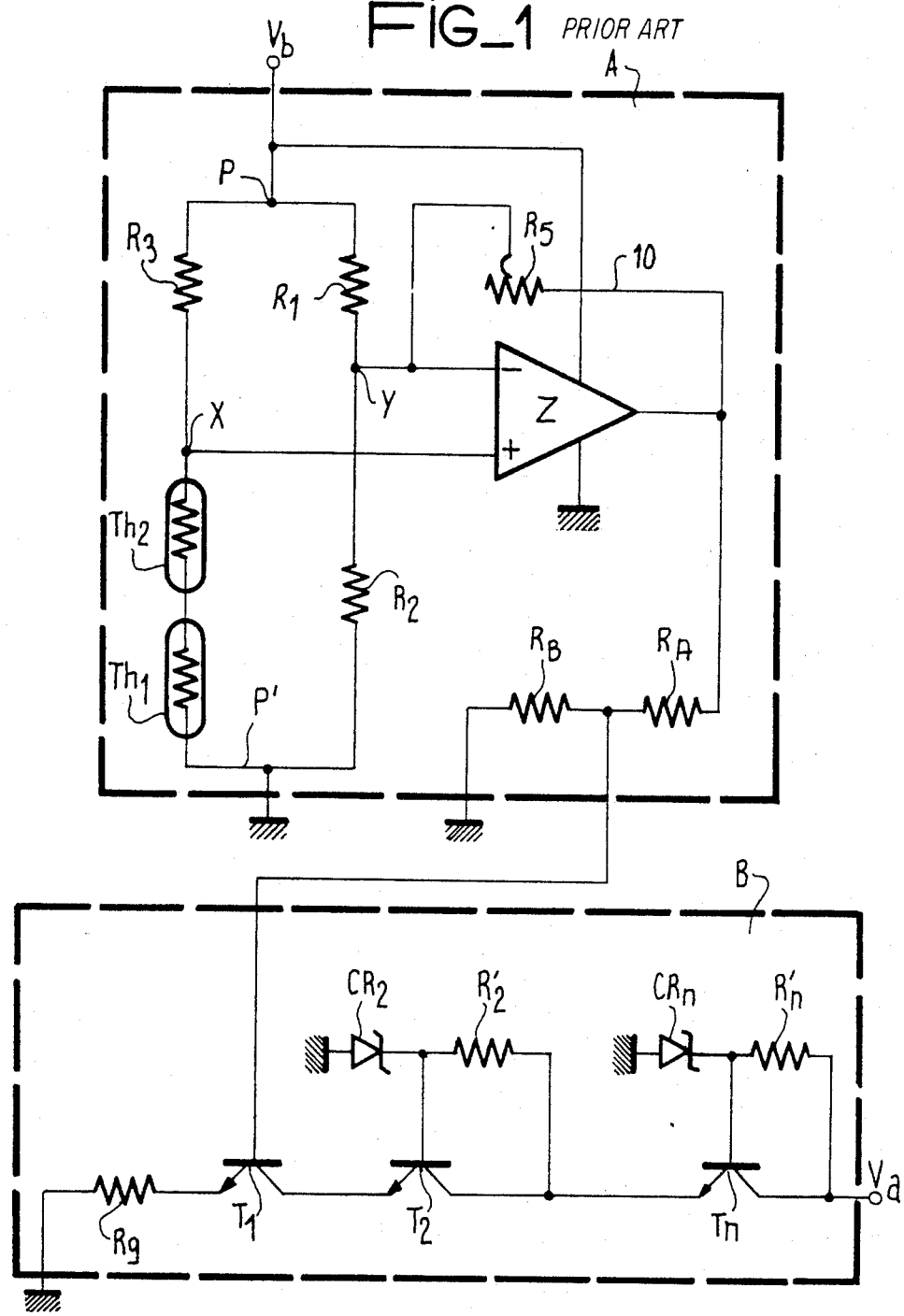
FIG_1 PRIOR ART

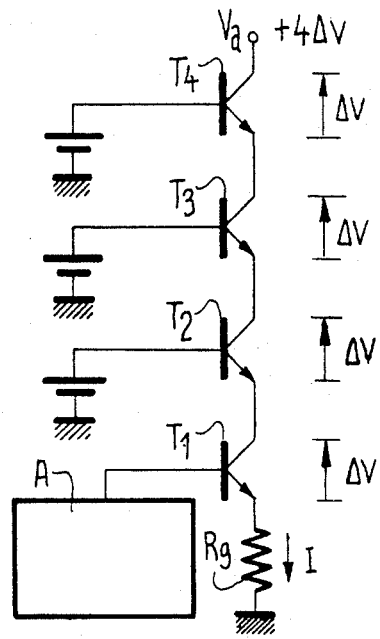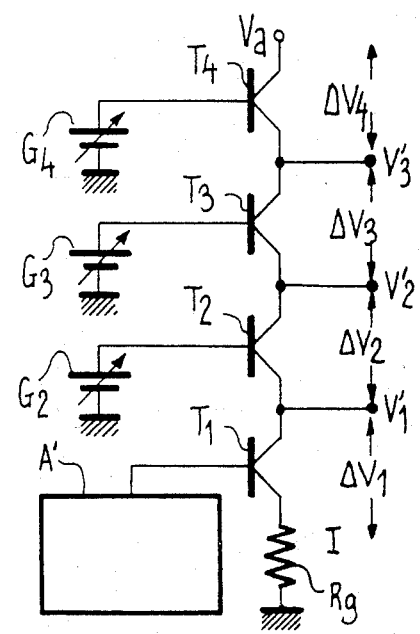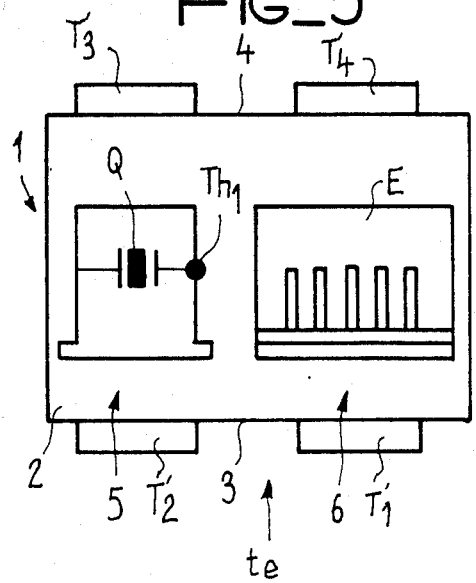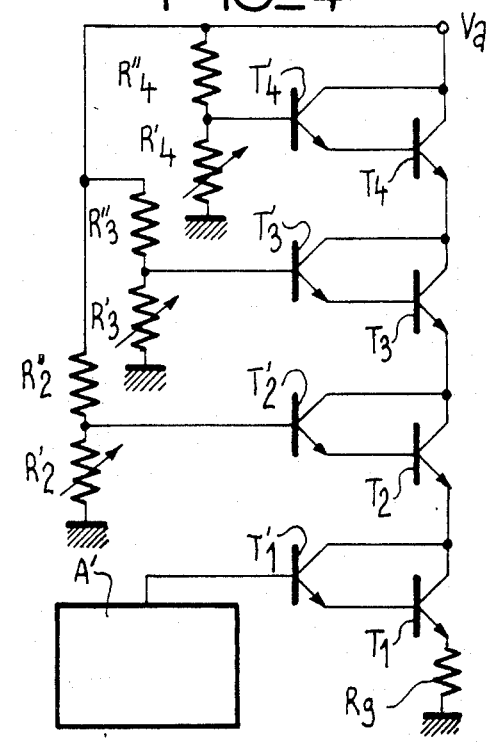

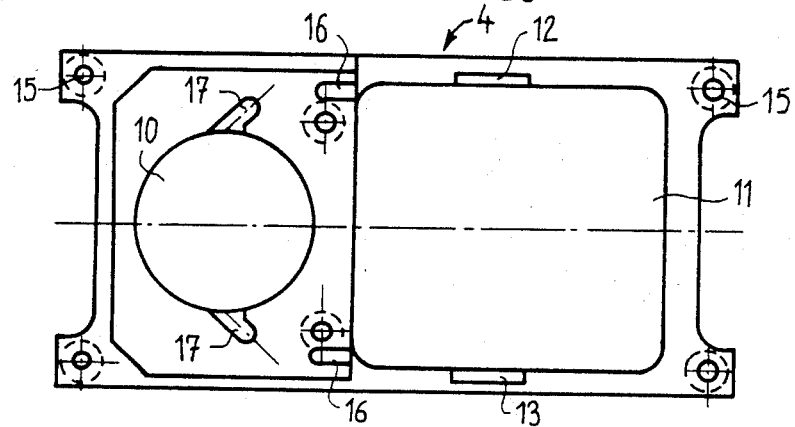
FIG_6-a
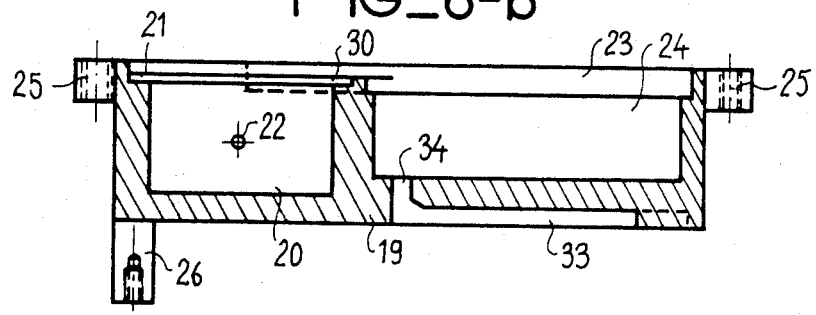
FIG_6-b
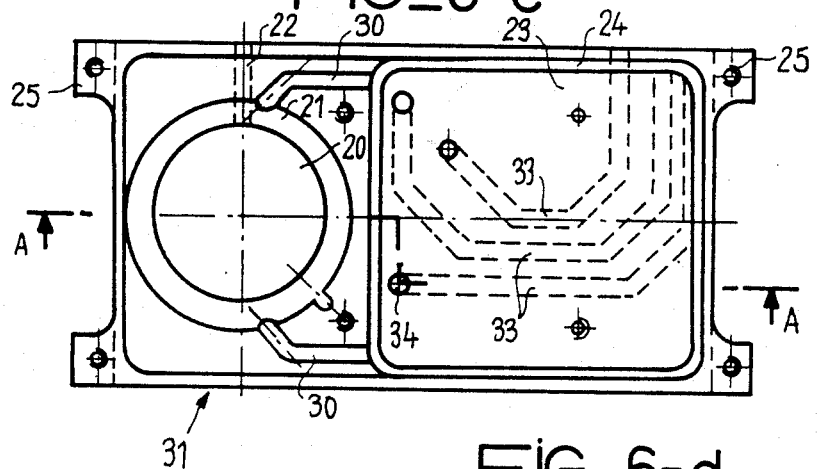
FIG_6-c
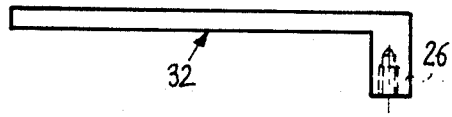
FIG_6-d

METHOD AND DEVICE FOR CONTROLLING THE HEATING OF A THERMOSTATICALLY CONTROLLED ENCLOSURE FOR AN OSCILLATOR

The present invention relates to a method and a device for controlling the heating of a thermostatically controlled enclosure of an oscillator, particularly a quartz oscillator.

BACKGROUND OF THE INVENTION

The applicant's European Pat. No. 4233 discloses a device for the thermal regulation of an enclosure, comprising a temperature measuring circuit on the one hand, and on the other hand a circuit for the heating of the enclosure supplied from a voltage source and controlled by means of the temperature measuring circuit, the latter comprising a resistance bridge of which one branch comprises a plurality of elements having a resistance variable as a function of the temperature, and an amplifier circuit providing a control signal as a function of the difference of potential existing between the extremities of one of the diagonals of the bridge. The heating circuit comprises a plurality of voltage stabiliser semiconductor circuits, each of these series-connected semiconductor circuits being submitted to a substantially identical fraction of the supply voltage and being traversed by a heating current adjustable by means of a control transistor submitted to the said control signal. The heating action may be performed by means of transistors or of voltage regulators.

This device enables a comparatively uniform heating to be secured, at a given temperature, of an enclosure of optional size, without the need to adjust the semiconductor circuits utilized. Each transistor of the series chain is exposed to a fraction of the total voltage and to the whole of the heating current and all the transistors dissipate an identical power.

An arrangement of this kind makes it possible to obtain homogenous heating of an enclosure to the extent, and only to the extent that the same appears in a homogenous form from the thermal point of view. As will be established in the following, the applicants have observed that the enclosures obtainable in practice, in particular for the piezo-electric oscillators, display certain disparities from this point of view.

In the case in which the heating energies are spread uniformly around the enclosure, the disparities of thermal conductivity of the components situated in different areas of the same will cause unevennesses in temperature manifested to the user by an unexplainable thermal drift of the oscillator, while the temperature control error signal is practically zero.

The drift is a maximum when the external temperature is very different from the reference temperature at which the thermostatically controlled enclosure is maintained and which corresponds approximately to the maximum temperature of the temperature range specified for the operation of the oscillator, and the applicants were led to interpret this result as being attributable to the fact that the temperature of the electronic system of the quartz oscillator differs substantially from the reference temperature at which it is wished to maintain the same, which difference is actually manifested by a drift of the quartz frequency as compared to the required frequency $f_O$, which evolves as has been observed.

SUMMARY OF THE INVENTION

The invention consequently has as its object a method and device which permits the adjustment of the heating of a thermostatically controlled enclosure of a oscillator in particular a quartz oscillator, and which permits at least partial compensation of the temperature uniformity defects within the enclosure, which are caused by the asymmetry of the same from the thermal point of view.

In fact, although it is comparatively easy to secure satisfactory thermal coupling between the casing containing the piezo-electric element, of quartz in particular, and the enclosure, the same does not apply to the associated electronics which may be thermally coupled to the enclosure in an imperfect manner only, being given that the same lacks a regular external outline.

In accordance with the method of the invention, the heating of the enclosure being provided by a plurality of heating elements controlled so as to cause the measured temperature of the enclosure to correspond to a reference temperature, the method comprises the following steps:

subjecting the thermostatically controlled enclosure to an external temperature close to the maximum temperature of the temperature range specified for the enclosure, and measuring the frequency $f_O$ of the oscillator, subjecting the thermostatically controlled enclosure to an external temperature close to the minimum temperature of the temperature range specified for the enclosure and cancelling out the difference in frequency of the oscillator from the frequency $f_O$ previously measured, by modifying the distribution of the powers dissipated by the different heating elements, with the result that the temperature uniformity defects within the enclosure are compensated at least partially throughout the range of operating temperature of the oscillator.

The adjustment of the reference temperature may advantageously be undertaken during step a.

According to a preferred embodiment, the heating circuit comprises a chain of voltage stabiliser semiconductor circuits connected in series and submitted to an adjustable fraction of a supply voltage in a manner such as to permit the said modification of the distribution of the energies dissipated, the semiconductor circuits being traversed by a heating current controlled by means of a control circuit which is situated at one end of the chain and is subjected to a control signal representing the difference between the measured temperature of the enclosure and the reference temperature.

The control circuit may be one of the said semiconductor circuits and may play a part in heating the enclosure.

For example, the heating circuit may comprise four heating elements, that is to say in sequence, a first one possibly forming the said control circuit, a second, third and fourth circuits, the said modification of the distribution of the powers dissipated being performed by displacement in a symmetrical manner and in a contrary sense of the said fractions of the supply voltage of the second and fourth voltage stabiliser semiconductor circuits.

The invention also provides a device for the application of the method. On the one hand, it comprises a circuit for controlling the temperature of an enclosure of a quartz oscillator in particular, comprising a temperature sensor, and on the other hand an enclosure heating circuit supplied by a voltage source and regulated by the temperature control circuit, the latter providing a control signal representing the difference between the measured temperature of the enclosure and the reference temperature, the heating circuit comprising a chain of series-connected voltage stabiliser semiconductor circuits, at least one of the said voltage stabiliser circuits providing a means for modifying its stabilised voltage, each of the semiconductor circuits being traversed by a heating current regulated via a control circuit which is situated at one extremity of the said chain and is subjected to the said control signal. The voltage stabiliser circuits providing the heating of the enclosure are distributed over a plurality of regions of the enclosure and the modification of at least one said stabilised voltage is performed in a manner such that the temperature uniformity defects within the enclosure are at least partially compensated.

According to an advantageous embodiment, the temperature sensor is situated close to the casing of the piezo-electric element; a quartz crystal in particular, of the oscillator and in thermal contact with the same.

The voltage stabiliser circuits providing the heating of the enclosure may be distributed about its circumference, preferably in thermal contact with a thermally conductive casing forming the thermostatically controlled enclosure, and in which are situated the casing of the piezo-electric element of the oscillator and its associated electronic system. The thermostatically controlled enclosure may comprise a first section in which is situated the piezo-electric element, and a second section in which is situated its associated electronic system, and the voltage stabiliser circuits are then in a first group with respect to the first section and in a second group with respect to the second section.

According to one embodiment, the voltage stabiliser circuits comprise a chain of transistors each supplied at its base with a given voltage, the emitter and collector of the adjacent transistors being interconnected, the modification of at least one stabilised voltage consisting in adjusting the base voltage of at least one of the transistors of the chain.

In the case in which the thermostatically controlled enclosure comprises a first section wherein is situated the quartz crystal and a second section wherein is situated its associated electronic system, the voltage stabiliser circuits will advantageously be embodied in the form of a chain of four transistors, namely a first, second, third and fourth transistors, each receiving a given voltage at its base, the emitter and collector of adjacent transistors being interconnected, the first transistor forming the control circuit, the stabiliser circuits of one of the said groups being formed by the two extreme transistors of the chain and those of the other group by the two central transistors of the chain, the base voltages of the second and fourth transistors being adjustable. The first group of transistors advantageously comprises the two central transistors of the chain, being the second and third, and the second group the extreme transistors of the chain, being the first and fourth.

According to an advantageous embodiment of the voltage stabiliser circuits, at least one of the said circuits providing a means for modifying its stabilised voltage is formed by a transistor arranged in a Darlington connection and of which the base voltage is adjustable. The base input voltage of the Darlington circuit or circuits is then determined by means of a divider bridge supplied with a constant voltage. The other transistors, and in particular the transistor forming the control circuit, may equally be arranged in a Darlington connection.

BRIEF DESCRIPTION OF THE DRAWINGS

A better understanding of the invention will be obtained from the following description, given by way of non-restrictive example, in conjunction with the accompanying drawings, in which:

FIG. 1 illustrates an embodiment of a device for the thermal regulation of an enclosure according to the prior art represented by the European Pat. No. 4,233;

FIG. 2 illustrates the voltage distribution in a device of this kind;

FIG. 3 illustrates an embodiment of the invention in which the stabiliser circuits are formed by a chain of transistors;

FIG. 4 illustrates a modification of FIG. 3 in which the transistors are arranged in a Darlington connection;

FIG. 5 illustrates a diagram of a thermostatically controlled enclosure according to the invention; and FIGS. 6a to 6d illustrate different views of the enclosure of FIG. 5.

DESCRIPTION OF THE PREFERRED EMBODIMENTS

Referring to FIG. 1, the temperature measuring circuit A has a plurality of heat sensor elements, in this case being two thermistors $Th_1$ and $Th_2$ connected in series. The thermistors are incorporated in one of the branches of a resistance bridge of which the other elements are $R_2$, $R_1$ and $R_3$. One of the diagonals of the bridge is supplied with a D.C. voltage and to this end receives a voltage $V_b$ at the point P, the opposite point P' of the diagonal being grounded.

The extremities XY of the other diagonal of the bridge are connected to the two inputs of an operational amplifier Z connected in feedback by means of a variable resistor $R_5$.

The heating circuit B comprises a chain of transistors connected in series via their emitters and collectors and denoted $T_1$ to $T_n$. These transistors are connected as a voltage regulator. The bases of the transistors $T_2$ to $T_n$ are kept at a constant potential by means of a Zener diode - resistance bridge such as $R'_n$, and $CR_n$ for the transistor $T_n$.

For its part, the base of the transistor $T_1$ is connected to the output of the operational amplifier via a divider bridge $R_A$, $R_B$. The connection of the transistor $T_1$ as an emitter follower has the result that its base voltage reappears at the level of its emitter, and since the same is earthed via a resistor $R_9$, the current I in the chain of transistors is determined by the variations of the base voltage of the transistor $T_1$ which may participate in the same way as the other transistors in the heating of the enclosure. The voltages are selected in a manner such that the transistors dissipate identical powers.

A heating operation of this nature assures temperature uniformity inside an ideal enclosure, that is to say homogenous from the thermal point of view.

However, it is difficult to fulfil this condition in practice, and for this reason, the performance factors regarding frequency stability of the quartz oscillator are impaired substantially by the thermal variations of the enclosure, which are the greater the more substantial is the difference between the ambient temperature and the temperature to which the enclosure is thermostatically controlled.

These residual differences are of comparatively low amplitude and difficult to eliminate for this reason.

It is desirable however to eliminate these differences in a manner such as to enable utilisation of thermostatically controlled enclosures operating within a temperature range margin and adapted to quartz crystals of very high stability.

It will be observed in FIG. 2 that, according to the prior art, each transistor has a voltage difference $\Delta V$ between its emitter and its collector and is traversed by the current I; that is to say that each transistor playing a part in the heating action dissipates the same power. It will be noted that if it is intended that $T_1$ should not play a part in the heating action, it is sufficient that $CR_2$ should have a very low Zener voltage and $T_1$ will dissipate but little.

By contrast, according to FIG. 3, each of the transistors $T_2$ to $T_4$ has a variable base voltage in accordance with the invention. To this end, the base of each transistor is supplied by a voltage generator, namely $G_2$ for the transistor $T_2$, $G_3$ for the transistor $T_3$ and $G_4$ for the transistor $T_4$. The generators $G_2$, $G_3$, $G_4$ permit variation of the collector voltages $V'_1$, $V'_2$ and $V'_3$ of the transistors $T_1$, $T_2$ and $T_3$, thus making it possible to modify the voltage differences $V_1$, $V_2$, $V_3$ and $V_4$ respectively, between the emitter and collector respectively, of the transistors $T_1$, $T_2$, $T_3$ and $T_4$. The result is that the relative amounts of power dissipated by the different transistors of the chain may be modified by means of these three adjustments.

In accordance with the embodiment of FIG. 4, each of the transistors $T_2$, $T_3$, $T_4$ and possibly $T_1$ is associated with a transistor $T'_2$, $T'_3$ and $T'_4$ and possibly $T'_1$, with which it constitutes a Darlington connection. This makes it possible to obtain a higher input impedance and consequently to supply the bases of each of the transistors connected as a Darlington array with a fraction of the voltage $V_a$ from the resistive divider bridge at a negligible electrical consumption. Thus, the transistors $T'_2$, $T'_3$ and $T'_4$ thus receive on their bases a fraction of the voltage $V_a$ from the resistive divider bridges $R'_2$, $R''_2$, $R'_3$, $R''_3$, $R'_4$, $R''_4$. At least one of the elements of the resistive divider bridges is variable, for example respectively the resistor $R'_2$, $R'_3$ and $R'_4$ connected between the base of each of the transistors $T'_2$, $T'_3$, $T'_4$ and earth.

According to FIG. 5, a thermostatically controlled enclosure 1 has a first section 5 comprising a quartz crystal Q situated is a casing which is advantageously thermally coupled with a thermistor $Th_1$, so that the heat regulation operates on the most significant variable, namely the temperature of the casing containing the quartz crystal Q. In a second section 6, the enclosure 1 has an electronic system E associated with the quartz crystal Q, the whole forming an oscillator. The heating transistors are distributed between two opposed lower and upper walls 3 and 4, respectively, of a thermally conductive enclosure 2.

At the level of section 5, the transistor $T_2$ is placed in thermal contact with the lower wall 3, opposite to the transistor $T_3$ placed in thermal contact with the upper wall 4. In this way, the transistors $T_2$ and $T_3$ are allocated for the heating of the section 5 containing the quartz crystal Q.

In the same manner, at the level of section 6, the transistor $T_1$ is placed in thermal contact with the wall 3 opposite to the transistor $T_4$ in thermal contact with the wall 4, these two transistors being allocated to the heating of section 6 containing the electronic system associated with the quartz crystal Q.

As has been stated in the foregoing, it is comparatively easy to secure satisfactory thermal coupling between the casing of the piezo-electric element, being a quartz crystal Q in particular, and the casing 2, whereas the thermal coupling of the electronic system E is less easy. The result is that the enclosure should be heated a little more intensively at the level of the section 6 than at the level of the section 5 in order to prevent harmful temperature differences.

According to one embodiment, the thermostatically controlled enclosure comprises an upper cover 4 (FIG. 6a), a casing element 19 (in vertical cross-section in FIG. 6b and in plan view in FIG. 6c), and a lower cover 32 (FIG. 6d).

The casing element 19 of a material of satisfactory thermal conductivity, has a bore 20 forming a cavity intended to receive the casing containing the quartz kept under vacuum. To this end, and allowing for clearances, the bore 20 has the same diameter and the same height as the casing of the quartz crystal, so that the latter which is secured via its flange situated in a recess 21, is in intimate thermal contact with the casing element 19. This thermal contact may be improved by utilising an appropriate lubricant. A bore 22 of small diameter, provided from the outside of the casing element 19 and leading into the bore 20 serves the purpose of housing a thermistor in thermal contact with the casing of the piezo-electric element, being a quartz crystal Q in particular.

The output wires of the piezo-electric element are led through grooves 30 provided at the upper surface of the casing element 19, which lead into a second cavity 24 intended to receive the compressed or composite electronic circuit of the oscillator. The circuit inverted so that its components lie within the cavity 24 has its rim placed in a recess 23 of the cavity 24 and its input, output and supply wires pass through bores 34 and are led at the lower surface of the casing element 19 into grooves 33 in which they are held by a lower cover 32 having a flat base, produced from a material having a satisfactory thermal conductivity. This arrangement permits keeping the electrical connections of the circuit at the governed temperature of the casing element. In respect of the input and output wires of the quartz crystal, the same function is performed by the grooves 30 referred to above.

The casings containing the quartz crystal and the electronic circuit are held in position by the upper cover 4 produced from a satisfactorily thermally conductive material. For its fastening, it has lugs 15 co-operating with tapped lugs 25 of the element 19. It equally has a recess 10 of sufficient depth to permit folding the output wires of the quartz crystal while accommodating a part of their curvatures in portions of the grooves 17 which are superposed over the corresponding parts of the grooves 30. In order to facilitate the bending of the wires at the side of the cavity 24, groove portions 16 are equally formed in the cover 4 above the corresponding part of the grooves 30. The recess 10 has a diameter approximately equal to that of the bore 20 to enable locking the flange of the quartz crystal casing in position. The cover 4 equally comprises two studs 12 and 13 formed at opposed sides of a recess 11 and intended to locate the edges of the circuit in the recess 23.

A description will now be given of the manner in which, in the case of FIG. 5 and of the associated FIGS. 6a and 6d, the heating intensities of the corresponding transistors are controlled in a manner such as to perform this equalisation. Firstly, it will be noted that the thermal differences occur in the longitudinal direction of the casing between the sections 5 and 6, but that this is thermally symmetrical in the lateral direction. The same power may thus be caused to be dissipated at the transistors $T_2$ and $T_3$ on the one hand, and the same power at the transistors $T_1$ and $T_4$ on the other hand.

In the four-transistor array of FIGS. 3 and 4, the adjustment is obtained by keeping $V'_2 = V_a/2$ and by altering $V'_1$ and $V'_3$ in such manner that $\Delta V_2 = \Delta V_3$, establishing that $\Delta V_1 = \Delta V_4$. The adjustment of the chain of transistors then comes down to the adjustment of a single parameter, being the symmetrical displacement of the voltages $V'_1$ and $V'_3$ with respect to the voltage $V'_2$. In this kind of regulating operation, there is no need for the base voltage of $T_3$ to be controllable, since the value of $V'_2$ is not modified.

The manner in which the regulating operation is performed in the case of an enclosure as illustrated in FIG. 5, will now be described. During a first stage, the thermostatically controlled enclosure 1 is subjected to a temperature close to the maximum temperature of the specified operating range, for example by placing the enclosure 1 in a stove. The frequency $f_O$ of the oscillator is then measured. Given that the scheduled temperature of the thermostatically controlled enclosure is very close to the ambient temperature, the temperature differences within the enclosure are very small and the frequency $f_O$ thus measured acts as a reference to check on the thermal quality of the enclosure 1.

During a second stage, the thermostatically controlled enclosure is subjected to an ambient temperature close to the lowest temperature of the temperature range specified. The frequency of the oscillator is then measured, which has as its value $f_O + \Delta f_O$, $\Delta f_O$ being able to be positive or negative. The presence of $f_O$ indicates the non-uniformity of the temperature within the enclosure, given that the temperature of the electronic system is no longer equal to that of the quartz crystal which is taken as a reference in view of the positioning of the thermistor. A small variation of the temperature of the electronic system actually causes a small variation $\Delta f_O$ of the frequency $f_O$ of the oscillator. The temperature differences within the enclosure are attributable to the fact that the heat inputs into the enclosure are not distributed rationally. The regulating operation consists in cancelling out the difference $\Delta f_O$ by modifying the distribution of the powers dissipated by the heating elements. As stated in the foregoing, $\Delta V_2$ is made equal to $\Delta V_3$ and this value is caused to vary until the compensation is secured. Since the compensation had been established at the ends of the operating temperature range of the enclosure, it will be applicable throughout this range.

By way of example, for a particular embodiment of an enclosure 1, and for a supply voltage $V_a = 24$ volts, with $V'_2$ equal to 12 volts therefore, the following values were determined:

$V'_1 = 10.5$ volts and $V'_3 = 13.5$ volts.

The relative drift in frequency of the oscillator throughout the range of operation, that is from minus 40° C. to plus 70° C., was limited to $2 \times 10^{-10}$ which corresponds to an improvement equal to at least one order of magnitude.

What is claimed is:

1. A method for regulating the heating of a thermostatically controlled enclosure of an oscillator, of which the heating is provided by a plurality of heating elements controlled to cause the measured temperature of the enclosure to correspond to a reference temperature, which comprises the following steps:
   a - subjecting the thermostatically controlled enclosure to an external temperature close to the maximum temperature of the temperature range specified for the enclosure, and measuring the frequency of the oscillator;
   b - subjecting the thermostatically controlled enclosure to an external temperature close to the minimum temperature of the temperature range specified for the enclosure and cancelling out the difference in the frequency of the oscillator from the frequency measured previously, by modifying the distribution of the powers dissipated by the different heating elements, with the result that the uniformity defects of the temperature within the enclosure are compensated at least partially throughout the operating temperature range of the oscillator.

2. A method according to claim 1, in which the adjustment of the reference temperature is performed during step a.

3. A method according to claim 1, wherein the heating circuit comprises a chain of voltage stabiliser semiconductor circuits connected in series and submitted to an adjustable fraction of a supply voltage in a manner such as to permit the said modification of the distribution of the quantities of energy dissipated, the semiconductor circuits being traversed by a heating current controlled by means of a control circuit which is situated at one extremity of the chain and is subjected to a control signal representing the difference between the measured temperature of the enclosure and the reference temperature.

4. A method according to claim 3, wherein the control circuit forms a semiconductor circuit of the chain.

5. A method according to claim 3, wherein the heating circuit comprises four successive elements and the said modification of the distribution of the quantities of power dissipated is performed by displacement in a symmetrical manner and in a contrary sense of the said fractions of the supply voltages of the second and fourth voltage stabiliser semiconductor circuits.

6. A device for regulating the heating of a thermostatically controlled enclosure for an oscillator comprising on the one hand a circuit for controlling the temperature of an enclosure of a quartz oscillator, comprising a temperature sensor, and on the other hand a circuit for heating the enclosure which is supplied by a voltage source and regulated by the temperature control circuit, the latter providing a control signal representing the difference between the measured temperature of the enclosure and a reference temperature, the heating circuit comprising a chain of series-connected voltage stabiliser semiconductor circuits, at least one of the said voltage stabiliser circuits providing a means for modifying its stabilised voltage, each of the semiconductor circuits being traversed by a heating current regulated by means of a control circuit which is situated at one extremity of the said chain and is subjected to the said control signal, and the voltage stabiliser circuits providing the heating of the said enclosure are distributed in a plurality of regions of the enclosure and the modification of at least one said stabilised voltage is performed in a manner such as to cause at least partial compensation for the defects in the uniformity of temperature within the enclosure.

7. A device according to claim 6, wherein the control circuit forms a semiconductor circuit of the chain.

8. A device according to claim 6, wherein the temperature sensor is situated close to the casing of a piezo-electric element of the oscillator and in thermal contact with the same.

9. A device according to claim 6, wherein the voltage stabiliser circuits are distributed about the periphery of the thermostatically controlled enclosure.

10. A device according to claim 9, wherein the voltage stabiliser circuits are in thermal contact with a thermally conductive casing forming the thermostatically controlled enclosure and in which are situated the casing of a piezo-electric element of the oscillator and its associated electronic system.

11. A device according to claim 9, wherein the thermostatically controlled enclosure comprises a first section in which is situated a piezo-electric element and a second section in which is situated its associated electronic system, and wherein the voltage stabiliser circuits are arranged in a first group in respect of the first section and in a second group in respect of the second section.

12. A device according to claim 6, wherein the voltage stabiliser circuits comprise a chain of transistors of which each receives a given voltage at its base, the emitters and collectors of the adjacent transistors being interconnected, the modification of at least one stabilised voltage consisting in adjusting the base voltage of at least one of the transistors of the chain.

13. A device according to claim 11, wherein the voltage stabiliser circuits comprise a chain of four successive transistors of which each receives a given voltage at its base, the emitters and collectors of the adjacent transistors being interconnected, the stabiliser circuits of one of the said groups being formed by the two extreme transistors of the chain and those of the other group by the two central transistors of the chain, and the base voltages of the second and fourth transistors of the chain are adjustable.

14. A device according to claim 13, wherein the said first group comprises the two central transistors of the chain, namely the second and third transistors, and the said second group comprises the two extreme transistors of the chain, namely the first and the fourth transistors.

15. A device according to claim 12, wherein at least one transistor having an adjustable base voltage is arranged in a Darlington connection, the base input voltage of a Darlington connection then being provided by a divider bridge supplied with a constant voltage.

* * * * *